(12) United States Patent
Ueno

(10) Patent No.: US 7,634,612 B2
(45) Date of Patent: Dec. 15, 2009

(54) METHOD OF RECORDING AND REPRODUCING INFORMATION

(75) Inventor: Toshiharu Ueno, Asaka (JP)

(73) Assignee: Fujifilm Corporation, Tokyo (JP)

( * ) Notice: Subject to any disclaimer, the term of this patent is extended or adjusted under 35 U.S.C. 154(b) by 476 days.

(21) Appl. No.: 10/829,168

(22) Filed: Apr. 22, 2004

(65) Prior Publication Data

US 2004/0213070 A1 Oct. 28, 2004

(30) Foreign Application Priority Data

Apr. 25, 2003 (JP) .............................. 2003-121785

(51) Int. Cl.
*G06F 12/00* (2006.01)
(52) U.S. Cl. .................. 711/103; 711/202; 365/185.33
(58) Field of Classification Search ........................ None
See application file for complete search history.

(56) References Cited

U.S. PATENT DOCUMENTS

| | | | |
|---|---|---|---|
| 6,411,552 B1 * | 6/2002 | Chiba .................... | 365/185.33 |
| 6,978,342 B1 * | 12/2005 | Estakhri et al. ............. | 711/103 |
| 7,050,190 B2 * | 5/2006 | Yamazaki et al. ........... | 358/1.15 |
| 7,123,512 B2 * | 10/2006 | Lakhani et al. ........ | 365/185.09 |
| 7,155,559 B1 * | 12/2006 | Estakhri et al. ............. | 711/103 |
| 2003/1001458 * | 1/2003 | Nakanishi ................... | 711/103 |
| 2004/0139310 A1 * | 7/2004 | Maeda et al. .................. | 713/2 |

FOREIGN PATENT DOCUMENTS

| | | |
|---|---|---|
| JP | 6-187205 A | 7/1994 |
| JP | 11053248 | 2/1999 |
| JP | 2001084180 | 3/2001 |

\* cited by examiner

*Primary Examiner*—Matt Kim
*Assistant Examiner*—Kaushikkumar Patel
(74) *Attorney, Agent, or Firm*—Birch, Stewart, Koasch & BIrch, LLP

(57) ABSTRACT

A method of recording and reproducing information is provided in which a recording area of a memory card is physically divided into small pages and is also partitioned into physical blocks each having a plurality of the pages so that information recorded in the page is erased in units of each block having the page. When an FAT area where information is changed frequently is allocated to a certain block, the FAT area is allocated to a page or pages in the block, and the remaining pages in the same block are made unavailable although they are unused.

12 Claims, 14 Drawing Sheets

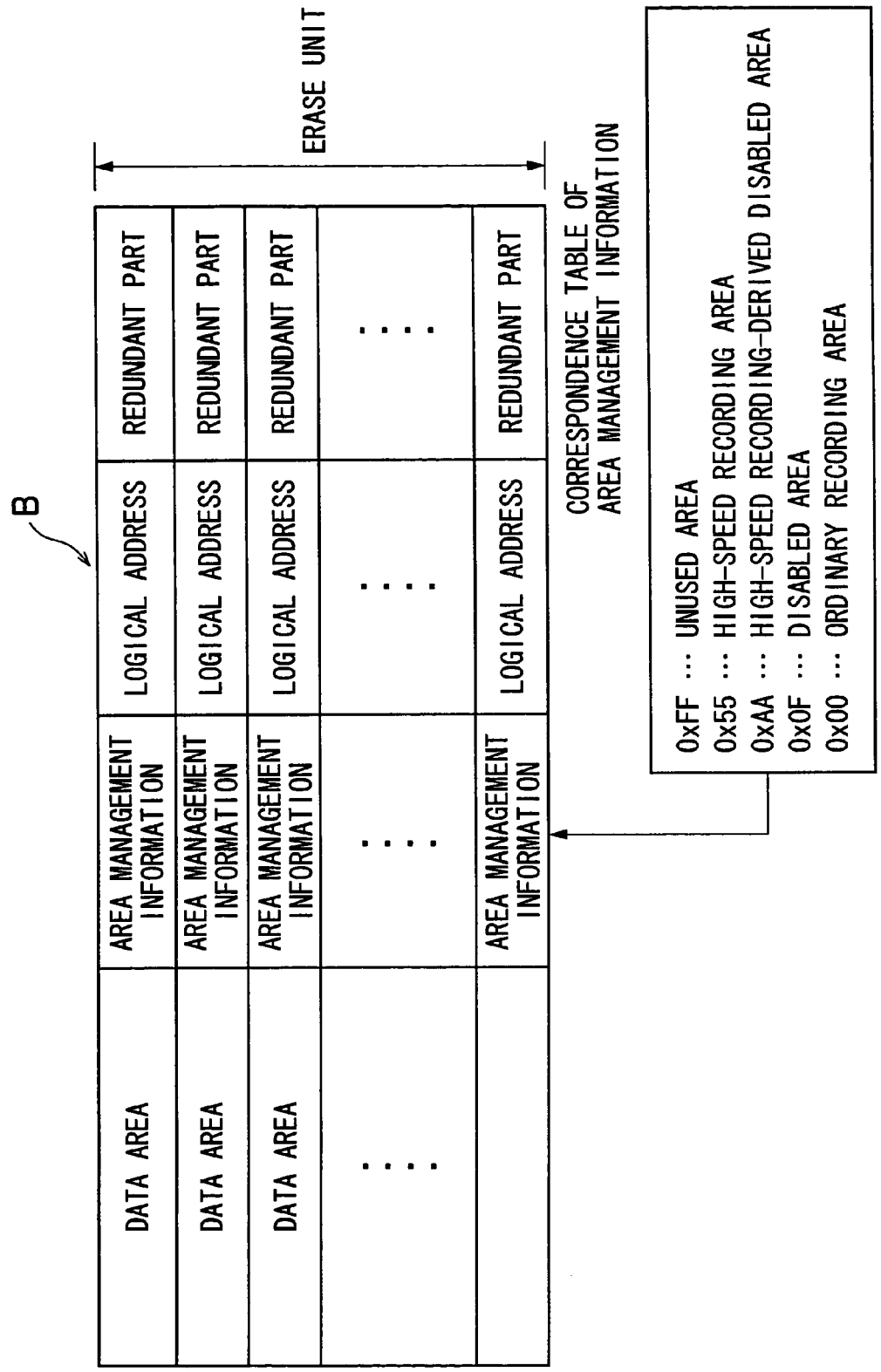

(b) ORDINARY RECORDING AREA (a) HIGH-SPEED RECORDING AREA

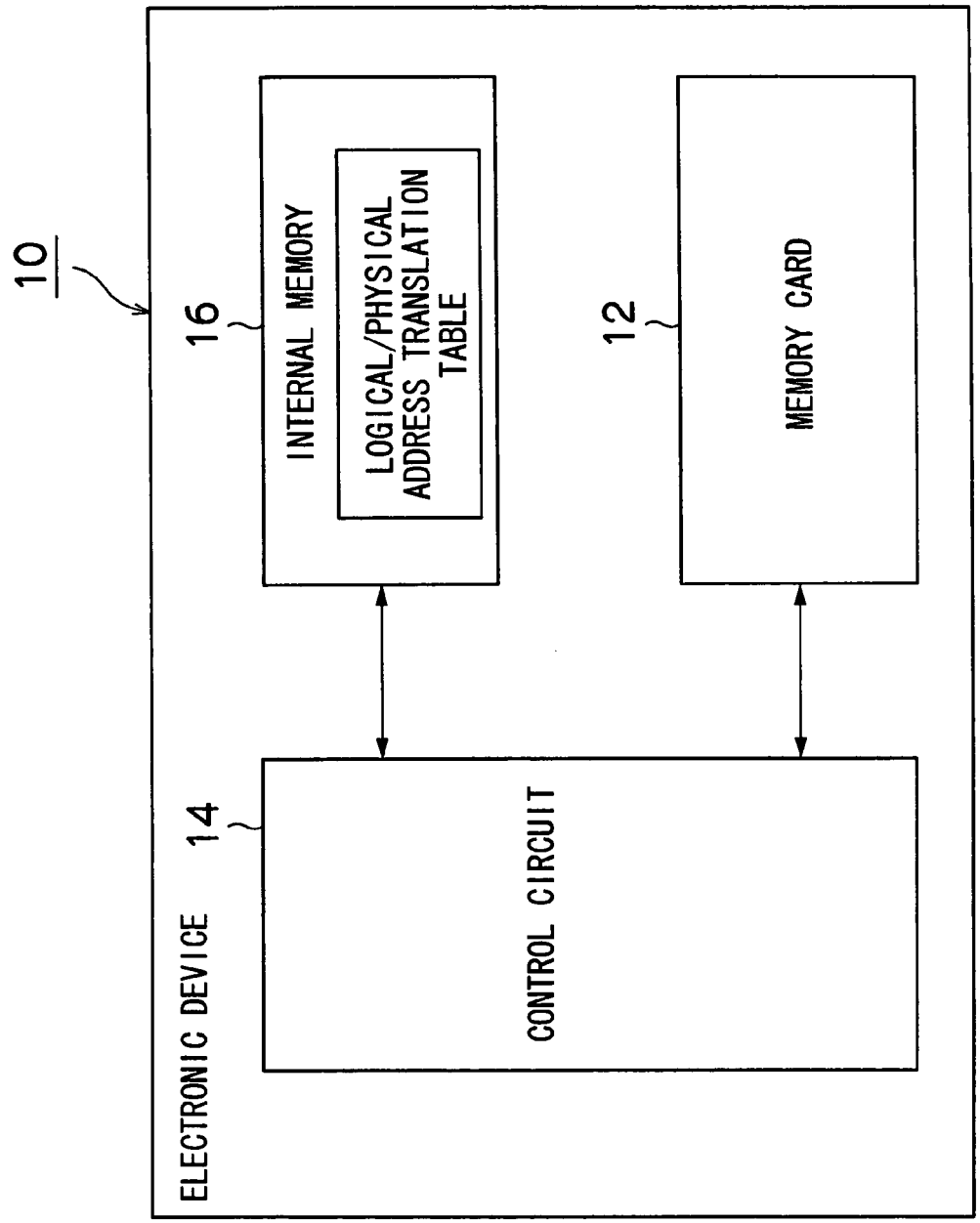

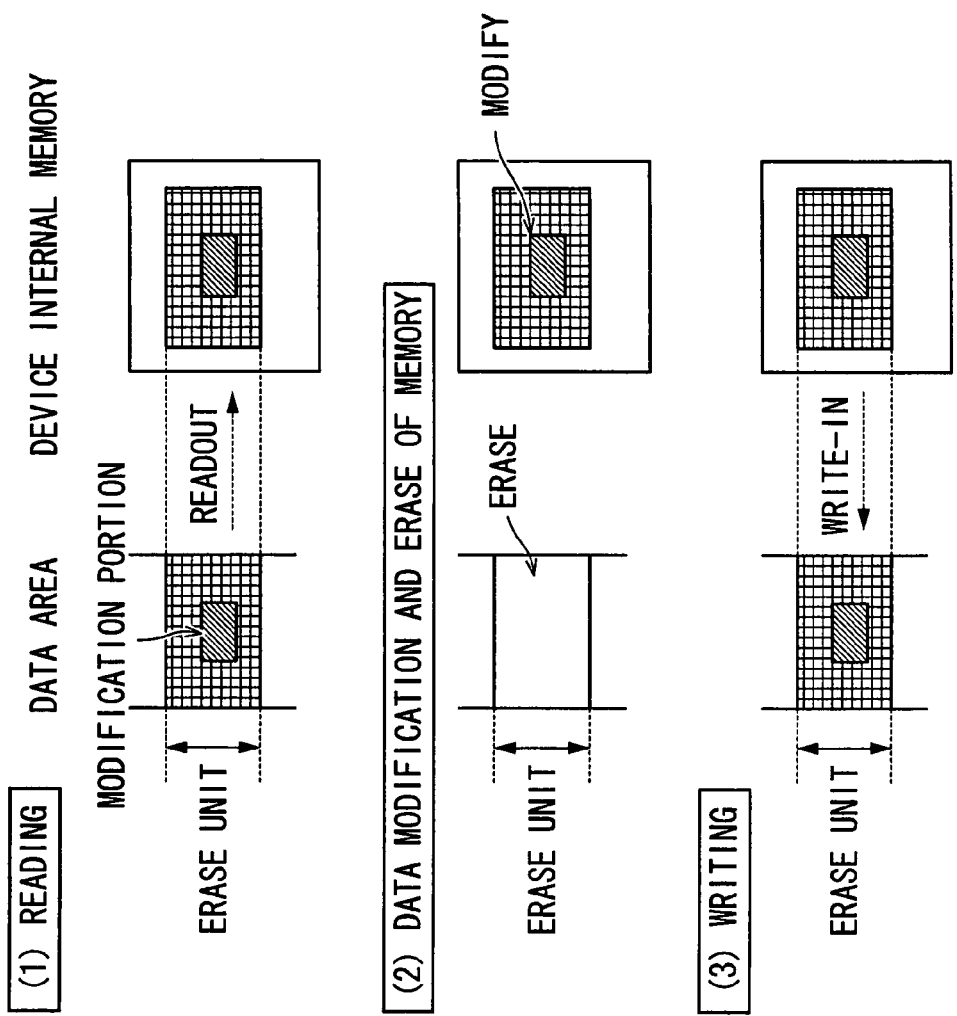

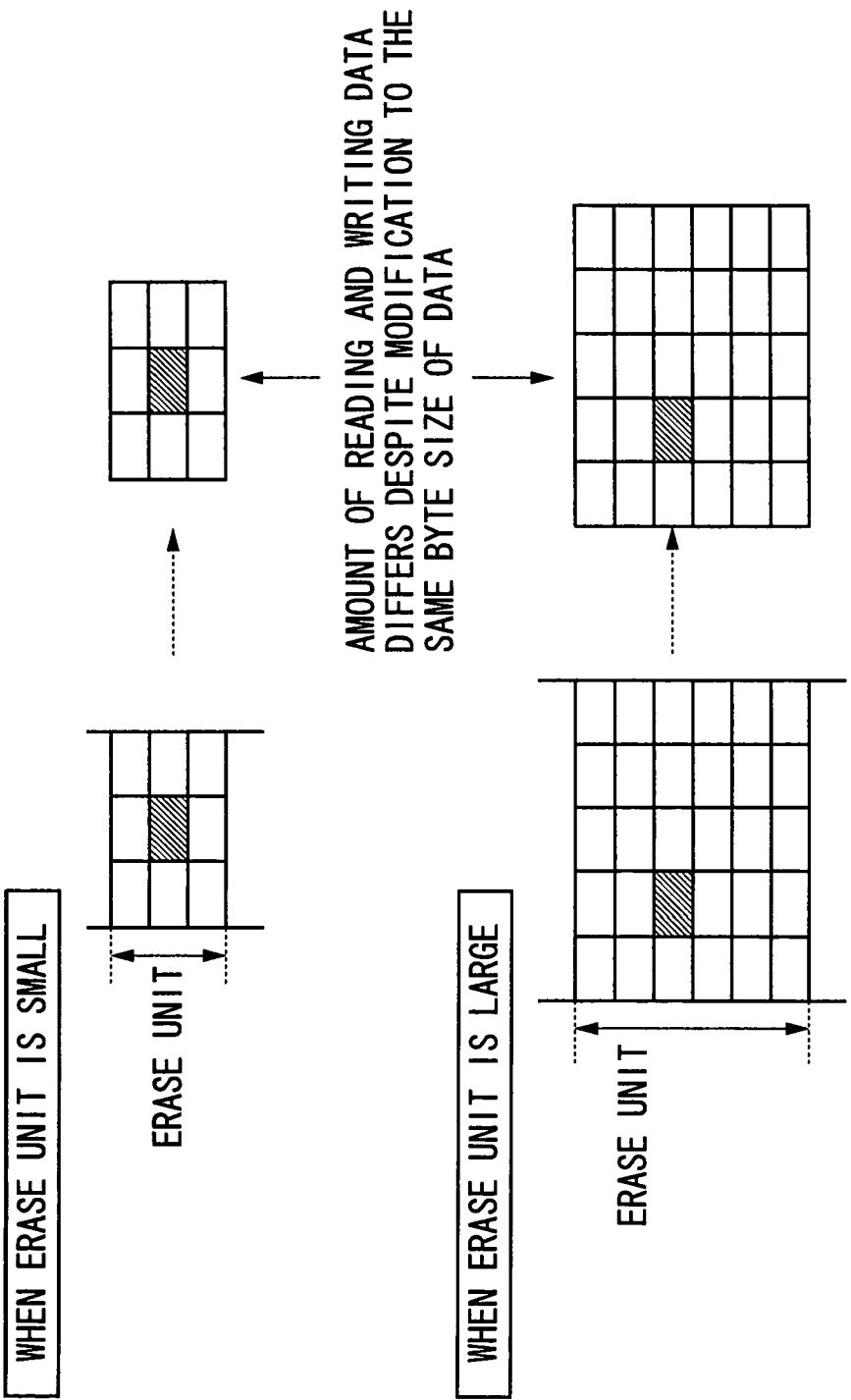

METHOD OF RECORDING AND REPRODUCING INFORMATION

This Non-provisional application claims priority under 35 U.S.C. § 119(a) on Patent Application No(s). 2003-121785 filed in Japan on Apr. 25, 2003, the entire contents of which are hereby incorporated by reference.

BACKGROUND OF THE INVENTION

1. Field of the Invention

The present invention relates to a method of recording and reproducing information, and more particularly, to a method of recording and reproducing information capable of realizing high-speed rewriting of data.

2. Description of the Related Art

Generally, in recording data into a memory card, efficient data manipulation is enabled by allocation of a physical recording area to logical space. Physical-to-logical mapping is performed by a method in which, as shown in FIG. 11, a logical address is assigned to each of physical constituent units (A, B, C, . . . ). When the memory card is used, all logical addresses therein are read first, followed by creation of a logical/physical address translation table which is used for translation from logical to physical addresses thereby to allocate the recording area in the physical space to the logical space, so that non-contiguously recorded data set is made contiguous in a virtual space.

In a memory card such as NAND memory, direct modification to a data area already containing information is prohibited. Therefore, partially modifying the data area requires the following steps as shown in FIG. 13:

① Read a data area containing locations of modification from the memory card and store it into an internal memory of a device;

② Erase the previous data area in the memory card in physical constituent units (erase units) and modify the data area in the internal memory; and ③ Write the data area modified in the internal memory into unused constituent units within the memory card.

There is recently an accelerating trend toward enlarging the erase unit with increasing memory card storage capacity. As shown in FIG. 14, even when two pieces of modification data in a file are the same in byte-size, reading/writing of data requires more time as the erase unit enlarges, with the trend moving toward larger internal memory capacity.

Particularly in an FAT (File Allocation Table) scheme which is one of ways to manage data, an area called FAT area is modified every time data is added or erased. Such repetitive small modifications disadvantageously increase erase units of memory and lengthen the processing time.

In order to achieve high-speed rewriting of the FAT area, the Japanese Patent Application Publication No. 6-187205 discloses a method in which the FAT and a root directory are read into a main memory from an EEPROM (Electrically Erasable and Programmable ROM) upon power-up, and subsequent processing is executed by accessing the FAT and root directory stored in the main memory, and furthermore these FAT and root directory in the main memory are written back into the EEPROM upon power-down.

SUMMARY OF THE INVENTION

The method described in the above Patent Application Publication No.6-187205, however, has its own disadvantage. Accidental power shutdown or unintended removal of the memory card is likely to lead to failure in reading of data in the memory card because the FAT has not properly been written thereto.

The present invention has been made in consideration of the above problem, and has its object to provide a method of recording and reproducing information capable of realizing high-speed rewriting of information liable to be changed frequently, such as those in a data management area, and also capable of preventing damage to the contents in a recording medium caused from unexpected power shutdown or unintentional removal of the recording medium.

In accomplishing the above object, according to a first aspect of the present invention, there is provided a method of recording and reproducing information in which a recording area of a recording medium is physically divided into small pages and is also partitioned into physical blocks each having a plurality of the pages so that information recorded in the page is erased in units of each block containing the page. The method comprises a step of, upon allocation to the block of a specific area where information is frequently changed, allocating the specific area to the page or pages in the block and disabling remaining pages in the same block as where the specific area is allocated although the remaining pages are unused.

More specifically, in allocating the specific area for information liable to be changed frequently to a certain block, the specific area is allocated to the page or pages in this block, and remaining pages in the same block as where the specific area is allocated are disabled although they are unused. This allows a distinction between the block where only the specific area is allocated and the block where areas other than the specific area (ordinary data area) are allocated, which leads to reduced amount of reading/writing data at modification of the specific area, resulting in high-speed rewriting of information of the specific area.

In accordance with a second aspect of the present invention, there is provided a method of recording and reproducing information according to the first aspect of the present invention, wherein the specific area is an area for managing data recorded in the recording medium. Information of the data management area such as an FAT area is modified frequently, and time required for the modification can be reduced.

In accordance with a third aspect of the present invention, there is provided a method of recording and reproducing information according to the first or second aspects of the present invention, wherein the page is provided with an area for recording area management information including information indicating that the specific area has been allocated, information indicating the disablement of the page although unused, information indicating an unused area, and information indicating an ordinary recording area.

In accordance with a fourth aspect of the present invention, there is provided a method of recording and reproducing information according to the second or third aspects of the present invention. The method further comprises steps of, upon recording of information into the recording medium, allocating the block being unused to logical space and recording information into the block; reading and modifying contents of the data management area in the recording medium; recording the modified data management area into another unused block in the recording medium; and erasing the data management area before modified, and turning the block where the data management area before modified has resided, into the block unused.

In accordance with a fifth aspect of the present invention, there is provided a method of recording and reproducing information according to the second or third aspects of the present invention. The method further comprises steps of, upon erasing of information in the recording medium, reading and modifying contents of the data management area in the recording medium; recording the modified data management area into the block being unused in the recording medium; erasing the data management area before modified, and turning the block where the data management area before modified has resided, into the block unused; and erasing the information to be deleted, and turning the block where the information has resided, into the block unused.

By adding and erasing information and rewriting information of the data management area according to the processing steps shown by the fourth or fifth aspects, high-speed rewriting of information of data management area can be realized, and also damage to the information of data management area can be prevented even in the event of unexpected power shutdown or unintended removal of the recording medium.

As described above, according to the present invention, when data is erased in units of physical blocks of a recording medium, a specific area such as a data management area is allocated to a page or pages in a certain block, and the remaining pages in the same block as where the specific area is allocated are made to be in a disabled state although they are unused. This allows a distinction between blocks allocated only with the specific area and blocks allocated with an area other than the specific area (ordinary data area), which leads to reduced amount of reading/writing data at modification to the contents of the specific area, resulting in high-speed rewriting of the contents of the specific area.

BRIEF DESCRIPTION OF THE DRAWINGS

FIG. 2 is a diagram showing a data structure of individual pages contained in a block within a memory card recorded according to the present invention;

FIG. 4 is a block diagram showing main components of an electronic device to which is applied a method of recording and reproducing information according to the present invention;

FIG. 13 is a diagram for illustrating rewriting of a data area in the memory card; and FIG. 14 is a diagram for illustrating a disparity in data amount of writing/reading data originated from a size difference of data area (erase unit) in the memory card.

DETAILED DESCRIPTION OF THE PREFERRED EMBODIMENTS

A preferred embodiment of a method of recording and reproducing information according to the present invention will be described below in detail with reference to the drawings.

First, an overview of the method of recording and reproducing information according to the present invention is as follows.

A recording area of a recording medium such as a memory card is physically divided into small pages which are typically 512 bytes in size, and is further partitioned into physical blocks each of which comprises a plurality of contiguous pages. Each block is assigned with an address for physical space (physical address). Information is read/written from/to the recording medium in pages, and is erased in blocks.

Figure 1:
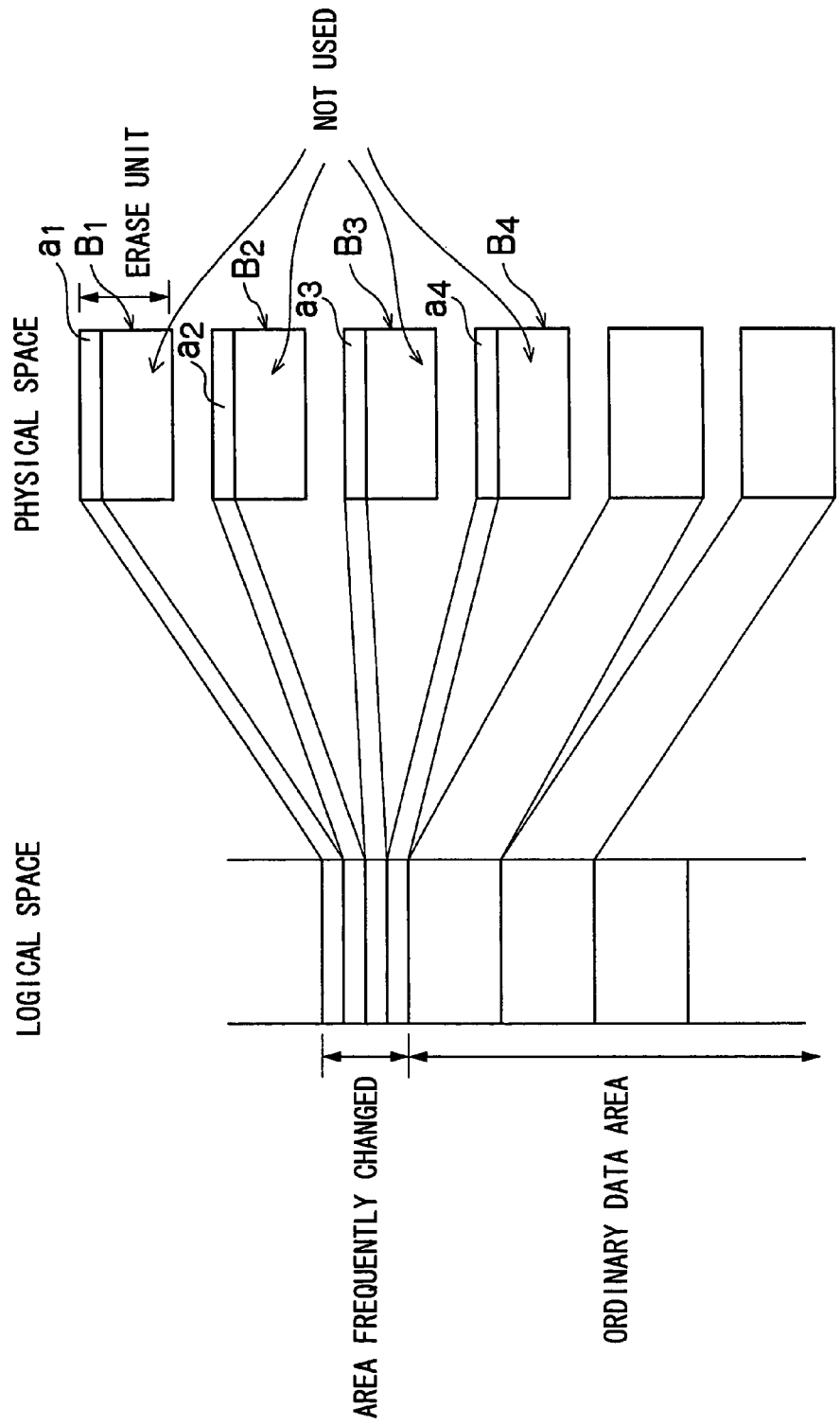
FIG. 1 is a diagram showing allocation of physical space of a memory card to logical space, which is intended to explain an overview of the present invention.
Figure 12:
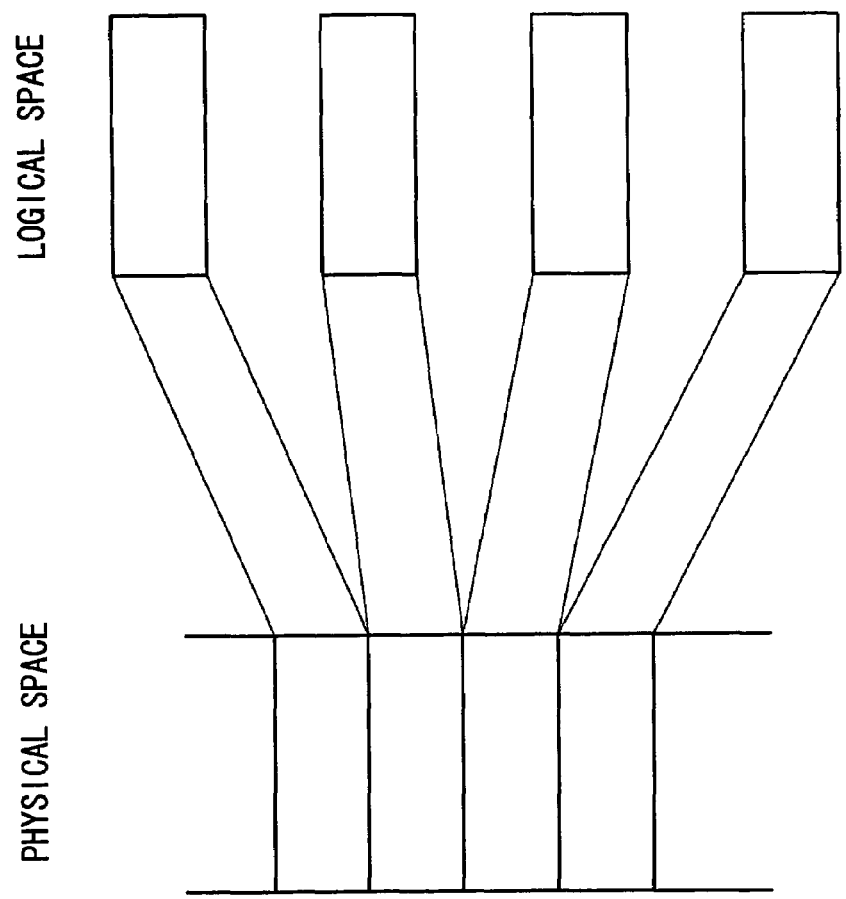
FIG. 12 is a diagram showing allocation of the physical space of the memory card to the logical space according to the prior art.

While data areas within the block are all allocated to logical space in a conventional art (see FIG. 12), the present invention is designed so that, as shown in FIG. 1, areas $a_1$, $a_2$, $a_3$ and $a_4$ where information is frequently changed, such as FAT areas, partially occupy blocks $B_1$, $B_2$, $B_3$ and $B_4$, respectively, and remaining areas of each block $B_1$, $B_2$, $B_3$ and $B_4$ are handled as unused areas. Accordingly, the areas $a_1$, $a_2$, $a_3$ and $a_4$ in the blocks $B_1$, $B_2$, $B_3$ and $B_4$ are allocated to the logical space, but the remaining areas are not.

FIG. 2 is a data structure of individual pages in the block within a memory card recorded according to the present invention. As shown herein, a physical block B in the memory card comprises a plurality of pages each of which consists of a data area, an area management information area, a logical address part, and an error correcting redundant part.

The data area stores original data, and the logical address part stores a logical address used for allocating physical pages or blocks to the logical space. The error correcting redundant part stores an error correction code, such as a Reed Solomon code, which is calculated for a set of data, area management information and logical address in each page.

In the present invention, each page contains an area for recording the area management information which is represented by a hexadecimal code. The hexadecimal code and the area management information indicated thereby are as follows:

0×FF . . . unused area
0×55 . . . high-speed recording area
0×AA . . . high-speed recording-derived disabled area
0×0F . . . disabled area
0×00 . . . ordinary recording area The unused area indicates the area available for writing data, the high-speed recording area indicates the area where the FAT area is recorded, the high-speed recording-derived disabled area indicates the area of pages made to be in a disabled state in order to allocate only the FAT area to a certain block, another disabled area is also the area made to be in a disabled state resulting from partial damage to storage elements during production or use of the memory card, and the ordinary recording area indicates the area where ordinary data other than the FAT is recorded.

Figure 3B:
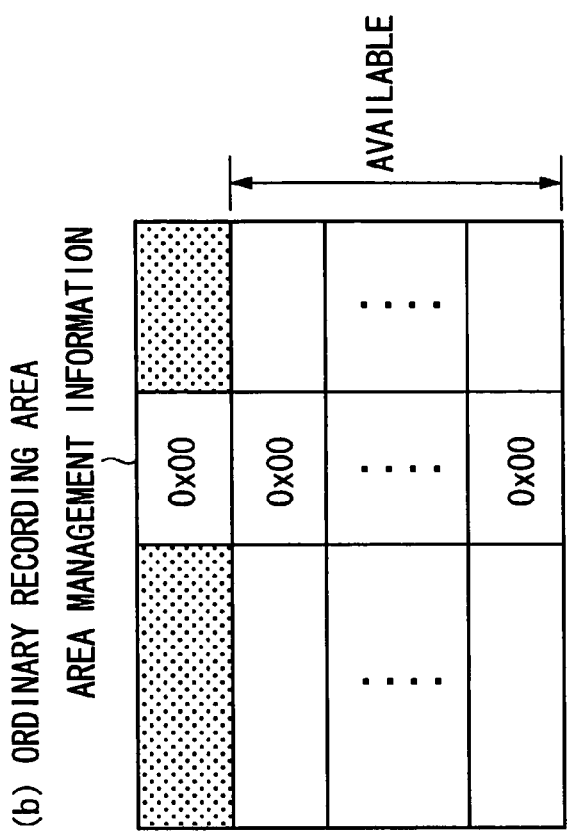
FIGS. 3A and 3B are diagrams showing contents in a block where a high-speed recording area is allocated and in a block where an ordinary recording area is allocated.
Figure 3A:
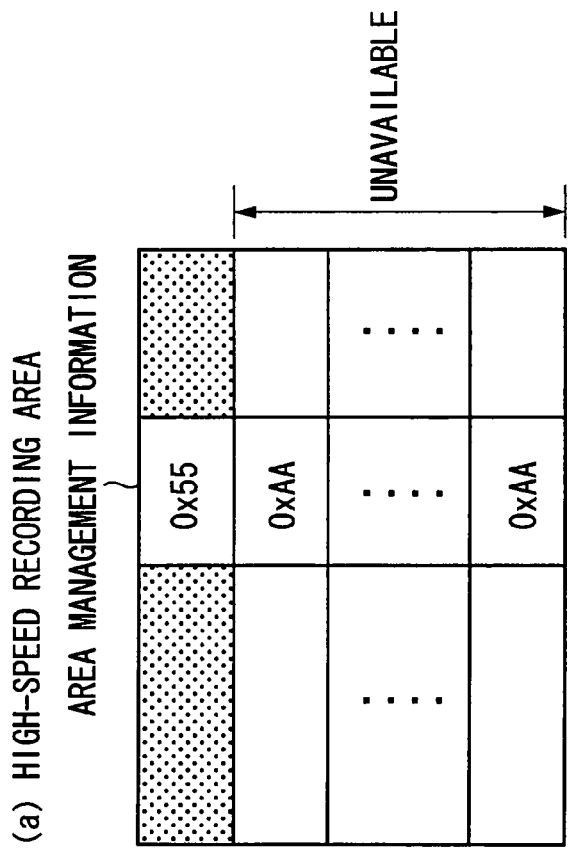

Now, in allocating the FAT area to a certain block, as shown in FIG. 3A, information of the high-speed recording area (0×55) is recorded as the area management information into a page within the block, and also in other pages in the same block, information of high-speed recording-derived disabled area (0×AA) is recorded as the area management information. Thus, pages other than those where the FAT area is allocated are neither used for data storage nor allocated to the logical space (see FIG. 1).

In recording the ordinary data into the memory card, as shown in FIG. 3B, information of the ordinary recording area (0×00) is recorded as the area management information in each page.

FIG. 4 is a block diagram showing main components of an electronic device to which is applied the method of recording and reproducing information according to the present invention. An electronic device 10 in this drawing is applicable to devices operable to read/write data from/to a memory card 12 (e.g., digital camera, personal computer, or the like), and mainly comprises a control circuit 14 and an internal memory 16 such as an SDRAM.

The control circuit 14 controls and manages the memory card 12, the internal memory 16, and the like. When data is input externally, the control circuit 14 controls recording data into the memory card 12. Upon receipt a readout instruction, the control circuit 14 controls readout and output of data from the memory card 12. Upon receipt of instructions for initializing the memory card 12 or erasing data recorded therein; the control circuit 14 controls initialization of the memory card 12 or erasing of data to be deleted.

Next, various processing steps executed by the control circuit 14 will be described referring to FIGS. 5 to 10.

Figure 5:
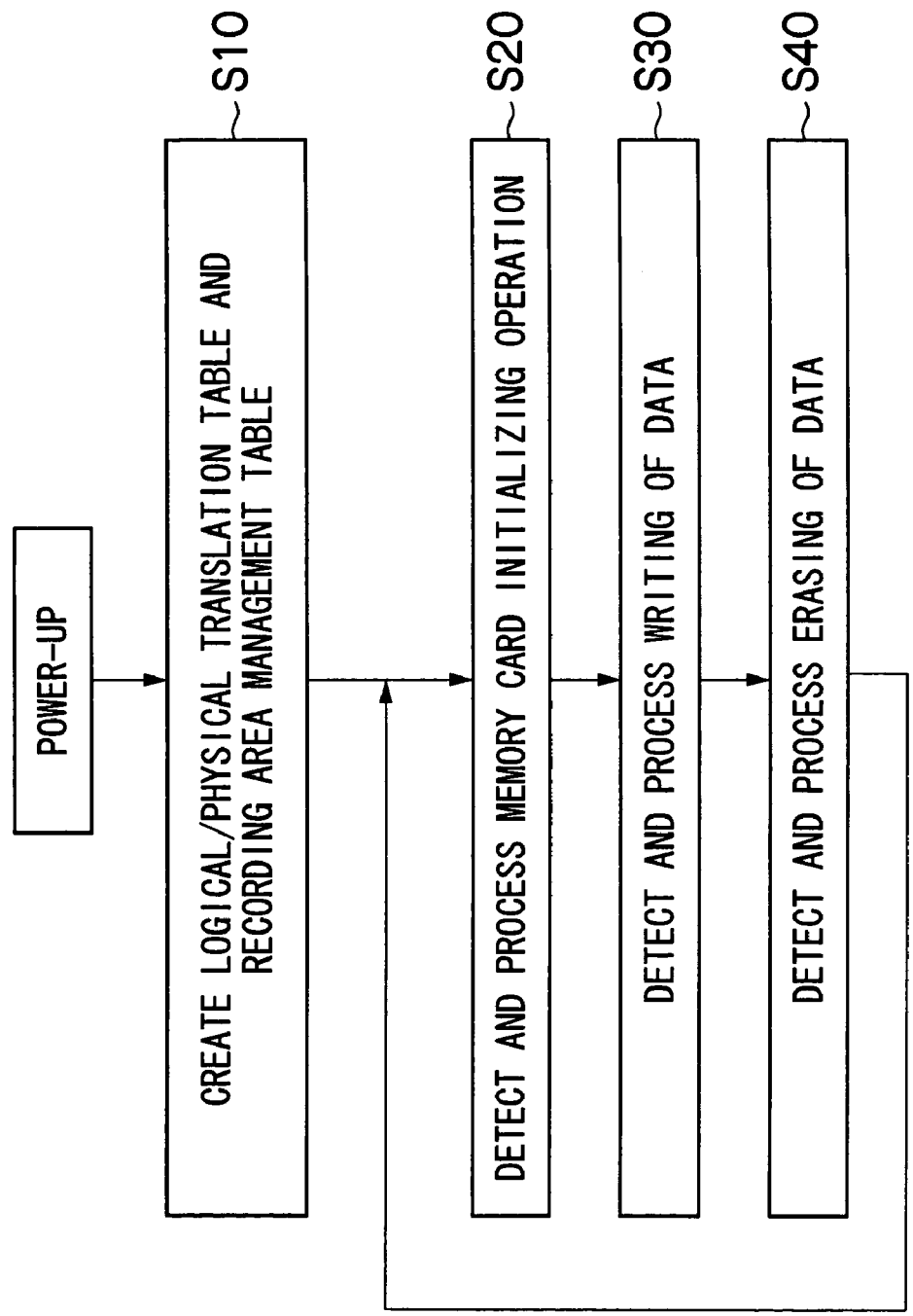
FIG. 5 is a flowchart schematically showing processing procedures performed when power is turned on according to the method of recording and reproducing information of the present invention.

FIG. 5 is a flowchart schematically showing processing procedures performed when the electronic device is powered on, according to the method of recording and reproducing information of the present invention.

As shown herein, when the device is powered on, the logical address and area management information are read from each block or page obtained by physically dividing the recording area in the memory card 12. Then, a logical/physical address translation table is created which is used to translate the read logical address to a physical address, and also a recording area management table is created based on the read area management information (step S10). Detailed descriptions of creating these logical/physical address translation table and recording area management table are provided later.

When both the logical/physical address translation table and recording area management table are prepared, the memory card 12 is initialized in response to an instruction, and data is written or erased in response to a request for writing or erasing data, using the previously created logical/physical address translation table and recording area management table (steps S20, S30, S40).

The following paragraphs are about procedures for creating the logical/physical address translation table and recording area management table, which are performed immediately after the device is powered on.

Figure 6:
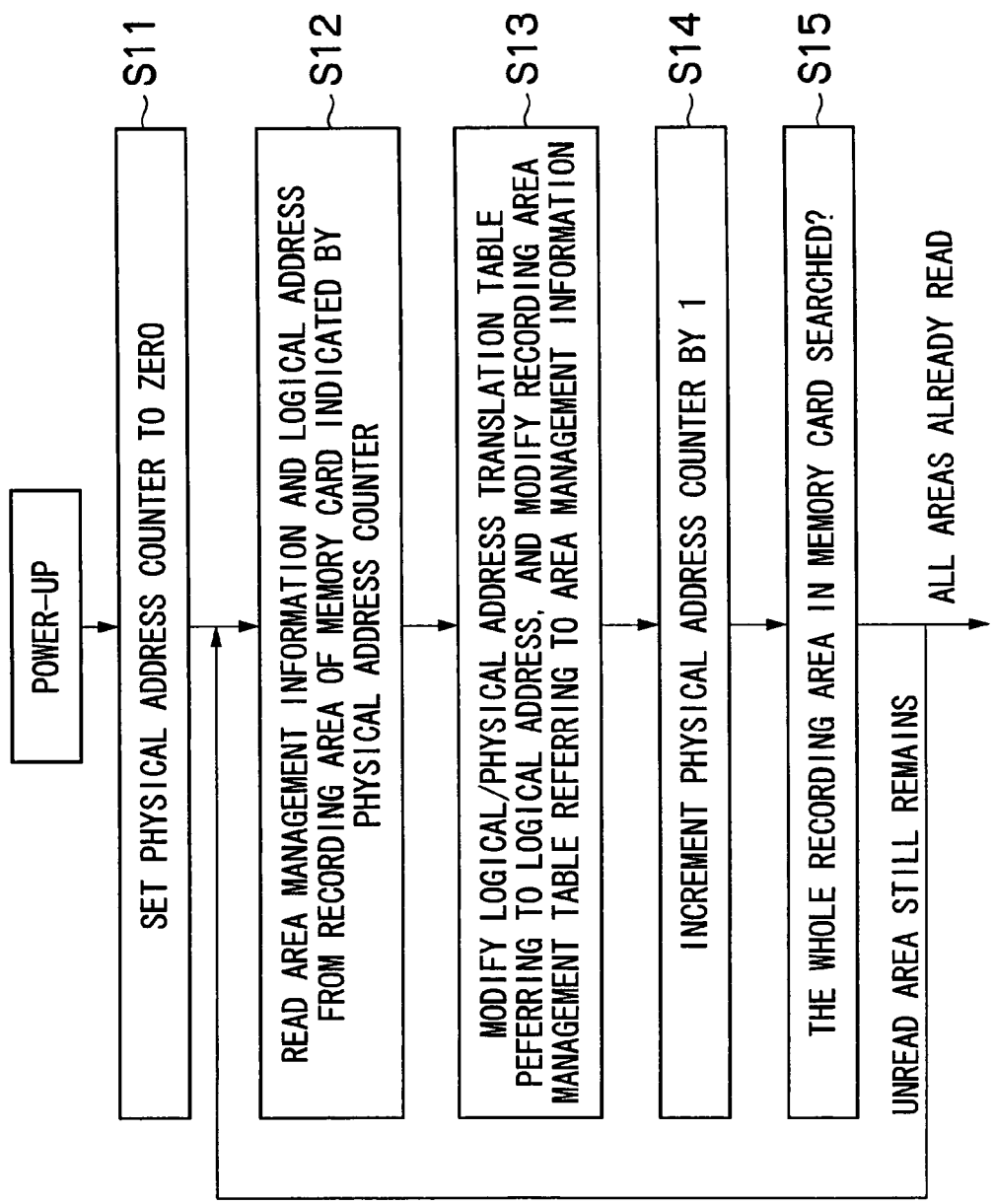
FIG. 6 is a flowchart showing procedures for creating a logical/physical address translation table and recording area management table.
Figure 7:
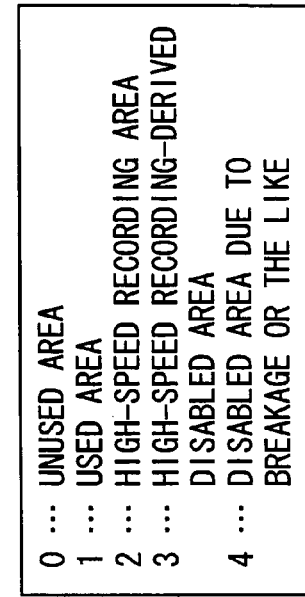
FIGS. 7A and 7B are diagrams showing examples of each logical/physical address translation table and recording area management table.

FIG. 6 is a flowchart showing the procedures for creating the logical/physical address translation table and recording area management table, and FIGS. 7A and 7B are diagrams exemplarily showing the logical/physical address translation table and recording area management table created according to the flowchart in FIG. 6.

Referring to FIG. 6, when power is turned on, a physical address counter of the memory card 12 is set to zero (step S11).

Next, the area management information and logical address are read from a recording area (page) of the memory card 12 indicated by a count value of the physical address counter (step S12).

The read logical address is added to the logical/physical address translation table, and also the read area management information is added to the recording area management table where it is mapped to the physical address (step S13).

Subsequently, the count value of the physical address counter is incremented by 1 (step S14), and based on the resultant count value it is determined whether logical addresses and area management information in all blocks within the memory card 12 are read or not (step S15). When reading of all the logical addresses and area management information has not completed, the processing returns to step S12 and processing steps from S12 to S15 are repeated. When reading of all the logical addresses and area management information has completed, the processing of creating the logical/physical address translation table and recording area management table shown in FIGS. 7A and 7B ends.

Figure 8:
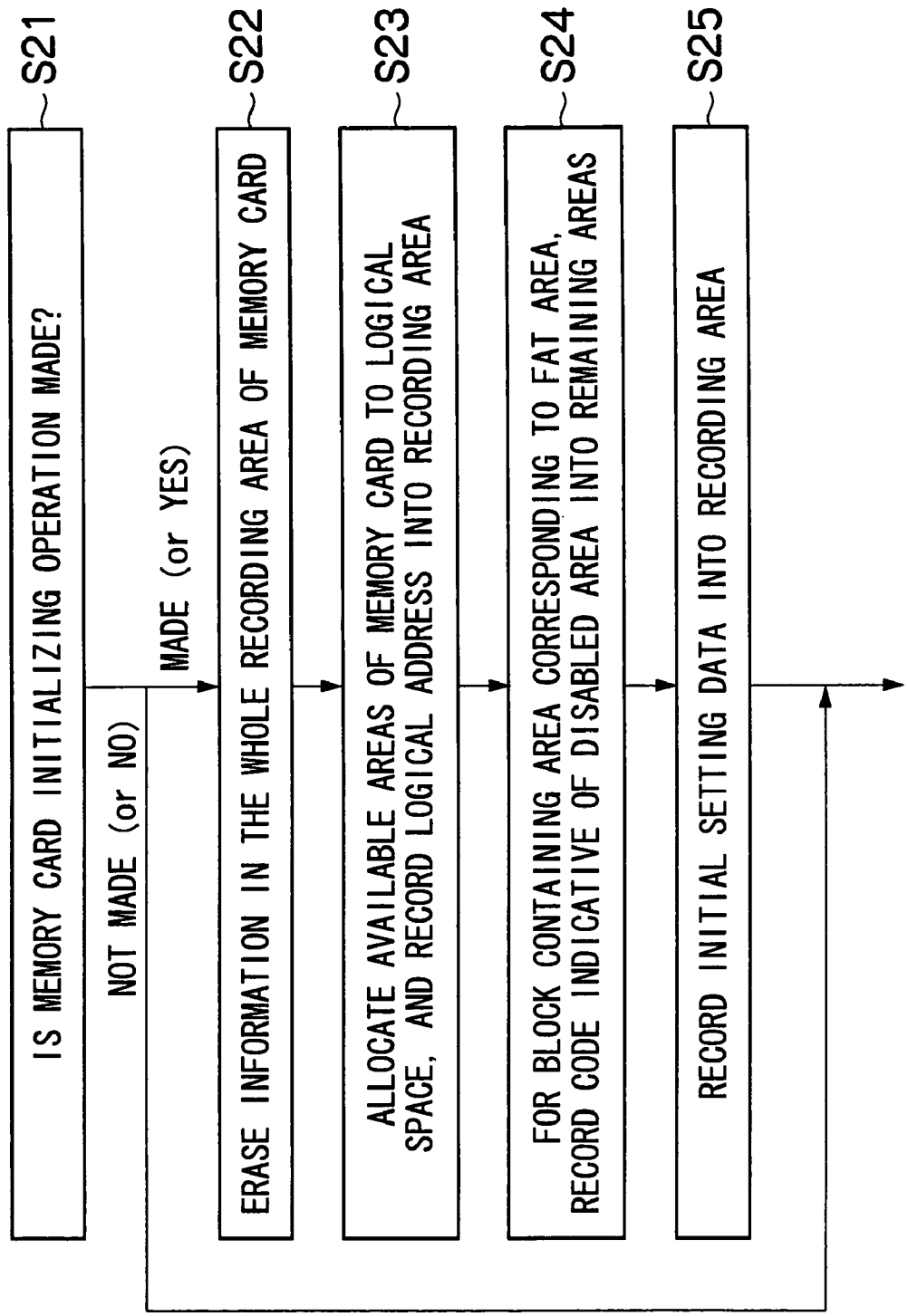
FIG. 8 is a flowchart for illustrating processing for initializing a memory card.

Next, processing of initializing the memory card 12 will be described with referring to the flowchart in FIG. 8.

When an initializing operation is performed for the memory card 12 (step S21), information recorded in the whole recording area within the memory card 12 is erased (step S22). Subsequently, available physical areas of the memory card 12 (blocks and pages) are allocated to the logical space, and then a logical address is recorded in the logical address part in each page (step S23). Furthermore, for a block containing a page corresponding to the FAT area, information of the high-speed recording area (0×55) is recorded into the area management information area in the page corresponding to the FAT area, and also information of the high-speed recording-derived disabled area (0×AA) is recorded into other pages of area management information areas in the same block as where the FAT is recorded. Moreover, information of the ordinary recording area (0×00) is recorded into the area management information area in each page within a block where ordinary data is recorded (step S24).

Finally initial setting data is recorded into the data area in the page where the information of high-speed recording area (0×55) has been recorded (step S25).

Figure 9:
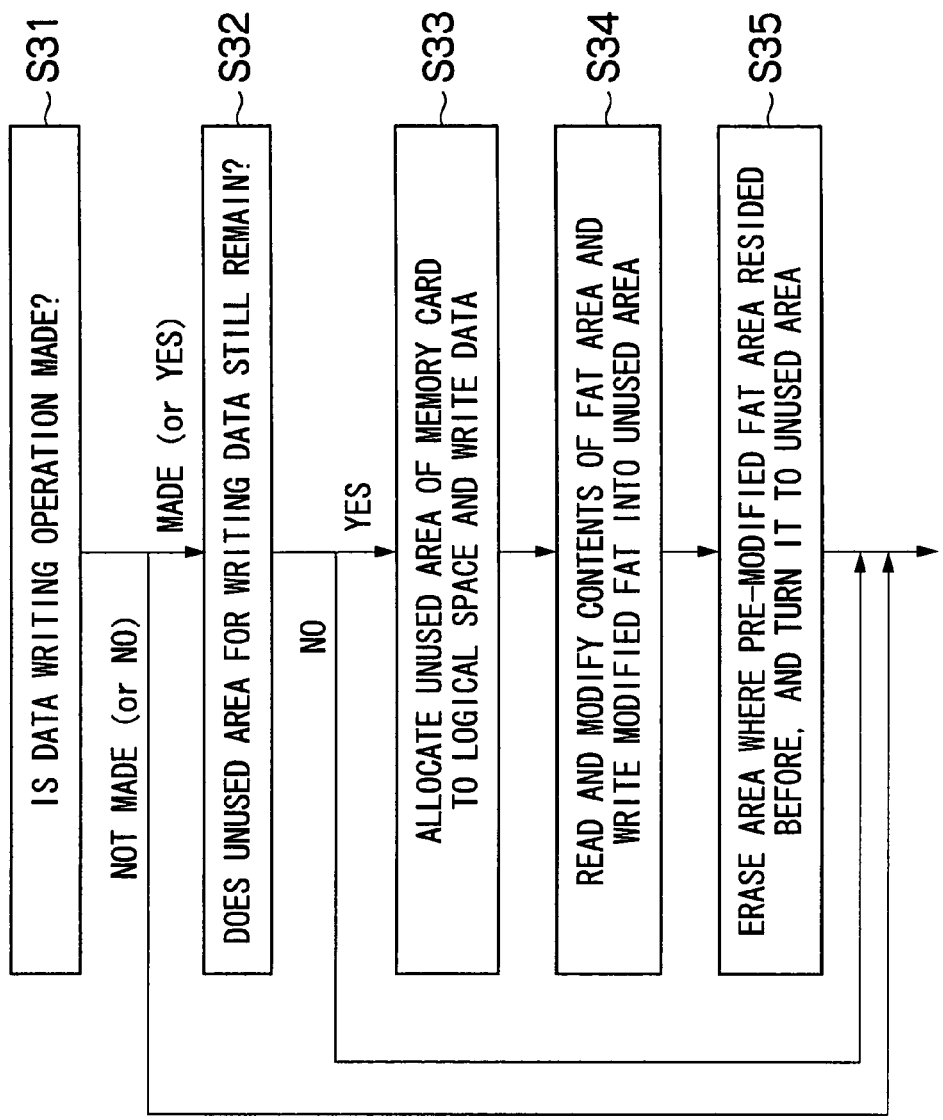
FIG. 9 is a flowchart for illustrating processing for writing data into the memory card.

Next, processing of writing data into the memory card 12 will be described referring to the flowchart in FIG. 9.

When a data writing operation is performed to the memory card 12 (step S31), it is determined whether the memory card 12 still has an unused area sufficient enough to write the data (that is, a block where the unused area is recorded as the area management information of each page (which is an unused block)) (step S32).

When the sufficient unused block available for writing data still remains, the unused block is allocated to the logical space, and a logical address is assigned to each page in this block. Furthermore, data, area management information, and logical address are written into each page (step S33).

Subsequently, the contents of FAT area in the memory card 12 are read to modify the FAT in relation to the written data, and then the modified FAT is rewritten into an unused block (step S34). At this time, the information of high-speed recording area is recorded as the area management information into the page where the FAT has been written, and also the information of high-speed recording-derived disabled area is recorded as the area management information into other pages where the FAT is not written, in the same block as where the FAT is recorded.

Finally, information in the block where the pre-modified FAT resided before is erased, and this block is turned to an unused block (step S35).

Figure 10:
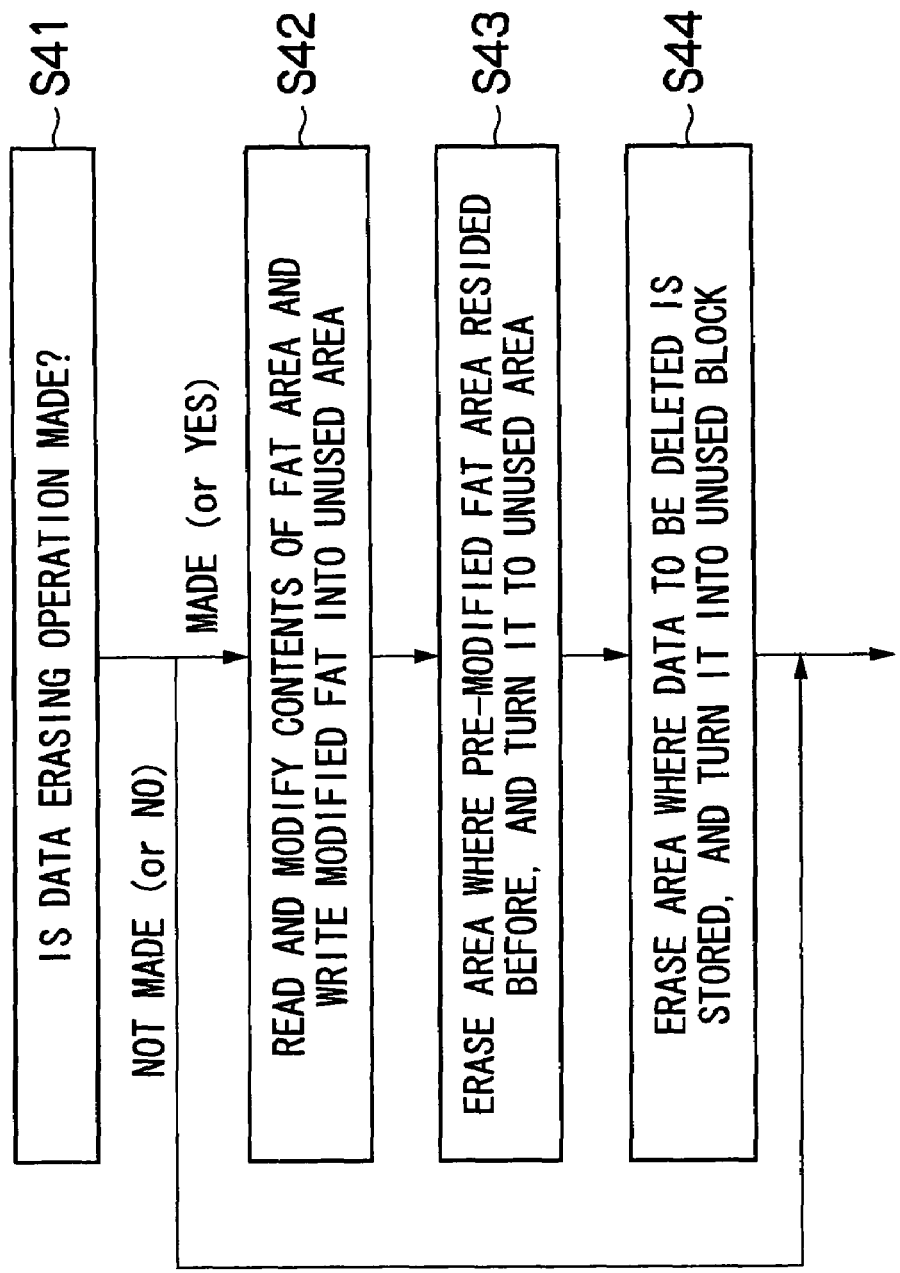
FIG. 10 is a flowchart for illustrating processing for erasing data from the memory card.
Figure 11:
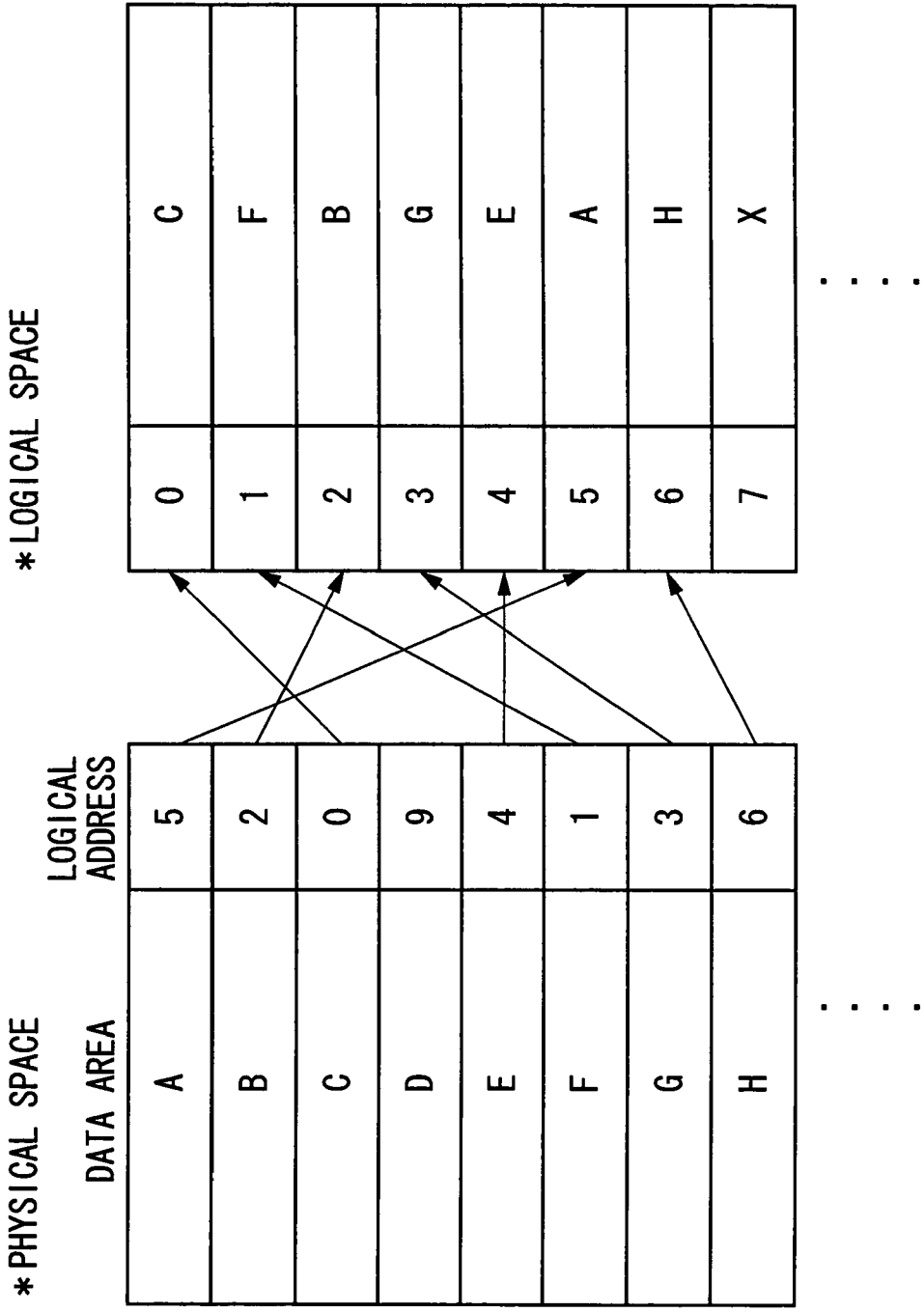
FIG. 11 is a diagram showing allocation of a recording area from physical to logical spaces using logical addresses.

Next, processing of erasing data in the memory card 12 will be described with reference to the flowchart shown in FIG. 10.

When a data erasing operation is performed to the memory card 12 (step S41), the contents of FAT area in the memory card 12 are read to modify the FAT in relation to the data to be erased, and then the modified FAT is rewritten into an unused block (step S42).

Subsequently, information in the block where the pre-modified FAT area resided before is erased, and this block is turned to an unused block (step S43).

Finally, information in the block where the to-be-erased data resides is erased, and this block is also turned into an unused block (step S44).

While this embodiment has dealt with the case where the area for managing data, such as an FAT area, is allocated to the high-speed recording area, the present invention is by no means limited thereto, and any other areas for information liable to be changed frequently, such as a directory area for recording root directory information, are also allowable.

What is claimed is:

1. A method of recording and reproducing information in which a recording area of a recording medium is physically divided into plurality of blocks and each block is partitioned into plurality of pages, said method comprising steps of:
   allocating a specific area having a frequently changing information to at least one page in one block of the plurality of blocks, wherein pages in said block each contain an area for recording area management information including information indicating an unused area, an allocated area, a disabled area, or an ordinary recording area; and
   disabling remaining pages in said one block when said allocating step allocates the frequently changing information to said at least one page in said one block, wherein said remaining pages include at least one page,
   wherein the frequently changing information is managing data recorded in the recording medium or root directory information.

2. The method of recording and reproducing information according to claim 1, wherein the at least one page is provided with an area for recording area management information including information indicating that the specific area has been allocated, information indicating the disablement of the page although unused, information indicating an unused area, and information indicating an ordinary recording area.

3. The method of recording and reproducing information according to claim 1,
   wherein the specific area is a data management area in which the managing data is stored as the frequently changing information,
   said method further comprising steps of:
   (6a) writing data into an unused block of the recording medium when a writing data operation is performed to the recording medium;
   (6b) reading contents of the data management area in said one block in the recording medium, the contents being the managing data;
   (6c) modifying the contents of the data management area in relation to the written data;
   (6d) writing the modified contents of the data management area into pages of another unused block in the recording medium;
   (6e) disabling other pages in said another unused block of the step (6d), wherein the modified contents were not written in said other pages; and
   (6f) erasing the contents of the data management area in said one block, and turning said one block into an unused block.

4. The method of recording and reproducing information according to claim 1,
   wherein the specific area is a data management area in which the managing data is stored as the frequently changing information,
   said method further comprising steps of:
   (9a) reading contents of the data management area in said one block in the recording medium, the contents being the managing data, when a data erasing operation is performed to the recording medium;
   (9b) modifying the contents of the data management area in relation to the data to be erased;
   (9c) writing the modified contents of the data management area into pages of an unused block in the recording medium;
   (9d) disabling other pages in said unused block of the step (9c), wherein the modified contents were not written in said other pages;
   (9e) erasing the contents of the data management area in said one block, and turning said one block into an unused block; and
   (9f) erasing the data to be erased, and turning a block where the data to be erased has resided, into an unused block.

5. The method of recording and reproducing information according to claim 1, wherein said one block contains the page corresponding to a FAT area, information a high-speed recording area (0×55) is recorded into the area management information in the page corresponding to the FAT area.

6. The method of recording and reproducing information according to claim 3, further comprising recording a logical address in a logical address part in each page.

7. The method of recording and reproducing information according to claim 1, wherein said allocating the specific area distinguishes said one block where the specific area is allocated from blocks where ordinary data area are allocated, so as to reduce amount of reading/writing data when modifying the contents of the specific area.

8. The method of recording and reproducing information according to claim 1, wherein
   said allocating step records an area management information with information indicating an allocated area, for said at least one page, and
   said disabling step records an area management information with information indicating a disabled area, for each of said remaining pages.

9. The method of recording and reproducing information according to claim 1, wherein each page in the blocks contains an area for recording area management information including information indicating
   an unused area which indicates the area is available for writing data
   an allocated area which indicates an area where a frequently changing information is recorded,
   a disabled area which indicates an area made to be in a disabled state in order to allocate only frequently changing information to other pages in said one block, or a disabled area which indicates an area in a disabled state due to damage, or an ordinary recording area which indicates an area where ordinary data other than a frequently changing information is recorded.

10. The method of recording and reproducing information according to claim 2, wherein said area management information is represented by a hexadecimal code.

11. The method of recording and reproducing information according to claim 1, wherein pages in said one block other than pages where the frequently changing information is allocated are neither used for data storage nor allocated to the logical space.

12. The method of recording and reproducing information according to claim 1, further comprising assigning a logical address to each page in said one block.

* * * * *